(12) United States Patent
Herr

(10) Patent No.: US 6,909,109 B2
(45) Date of Patent: Jun. 21, 2005

(54) SUPERCONDUCTING DIGITAL FIRST-IN FIRST-OUT BUFFER USING PHYSICAL BACK PRESSURE MECHANISM

(75) Inventor: Quentin P. Herr, Torrance, CA (US)

(73) Assignee: Northrop Grumman Corporation, Los Angeles, CA (US)

(*) Notice: Subject to any disclaimer, the term of this patent is extended or adjusted under 35 U.S.C. 154(b) by 0 days.

(21) Appl. No.: 10/628,779

(22) Filed: Jul. 28, 2003

(65) Prior Publication Data

US 2005/0023518 A1 Feb. 3, 2005

(51) Int. Cl.[7] .................. H01L 29/06; H01L 31/0256; H01L 39/22
(52) U.S. Cl. .......................................... 257/31; 257/30
(58) Field of Search ..................................... 257/30, 31

(56) References Cited

PUBLICATIONS

K.K. Likharev and V.K. Semenov; "RSFQ Logic/Memory Family: A New Josephson–Junction Technology for Sub–Terahertz–Clock–Frequency Digital Systems"; IEEE Transactions on Applied Superconductivity; vol. 1; No. 1; Mar. 1991; pp. 3–28.

M.W. Johnson et al.; "NbN Circuits and Packaging for 10 Kelvin IR Focal Plane Array Sensor Signal Processing"; IEEE Transactions on Applied Superconductivity; vol. 9; No. 2; Jun. 1999; pp. 4357–4360.

L. Wittie et al.; "CNET: Design of an RSFQ Switching Network for Petaflops–Scale Computing"; IEEE Transactions on Applied Superconductivity; vol. 9; No. 2; Jun. 1999; pp. 4034–4039.

Shinichi Yorozu et al.; "Design and Implementation of an RSFQ Switching Node for Petaflops Networks"; IEEE Transactions on Applied Superconductivity; vol. 9; No. 2; Jun. 1999; pp. 3557–3560.

Primary Examiner—Long Pham
(74) Attorney, Agent, or Firm—Harness, Dickey & Pierce

(57) ABSTRACT

A digital first-in first-out (FIFO) buffer (10) for use with Single Flux Quantum (SFQ) superconductive integrated circuits. The digital FIFO buffer (10) includes a clock-storage circuit (14) for receiving and storing load and read clock signals (100, 104) and a data-storage circuit (16) connected to the clock-storage circuit (14) for receiving and storing data signal pulses (102) in the order which the data signal pulses (102) are received relative to the load clock signal (100). The data-storage circuit (16) outputs the SFQ pulse signal independent of the load clock signal (100). The previously stored clock and data signal pulses (100, 102) provide physical back pressure to their subsequent signal pulses.

20 Claims, 4 Drawing Sheets

1) Initial State

| | 1 | 1 | 1 | 1 |
|---|---|---|---|---|
| | 1 | 0 | 0 | 1 |

2) Read

| | | 1 | 1 | 1 | ← -1 $\int^{104}$
|---|---|---|---|---|
| | | 1 | 0 | 0 | → 1

3) Load 1

| | 1 | 1 | 1 | 1 |
|---|---|---|---|---|
| | 1 | 1 | 0 | 0 |

100 —— 1 →
102 —— 1 →

FIG. 3C

SUPERCONDUCTING DIGITAL FIRST-IN FIRST-OUT BUFFER USING PHYSICAL BACK PRESSURE MECHANISM

BACKGROUND OF THE INVENTION

1. Field of the Invention

The present invention relates generally to first-in first-out (FIFO) buffers, and more particularly, to digital FIFO buffers for use with Single-Flux-Quantum (SFQ) superconductor integrated circuits for a physical-back-pressure mechanism.

2. Discussion of the Related Art

As a result of recent developments in superconductor technology, superconductor devices based on the Josephson effect are replacing conventional devices based on semiconductor technology for high performance and low power. The superconductor devices are well known as the ultimate high-speed, low-power digital logic family and are scalable to very-large scale integrated (VLSI) circuits. Digital circuits that employ superconductor devices and are fabricated using present circuit fabrication technology operate at clock rates ranging between 10–100 GHz. However, due to the high clock rates of superconductor devices, clock skew, clock jitter, and signal-propagation latency may often be larger than the clock period in the superconductor integrated circuits. These factors prevent cross-chip and chip-to-chip communication of such devices and lead to erroneous results.

The use of a first-in first-out (FIFO) buffer memory provides a well-known solution to achieve high data rates between incoherent synchronous circuits in the presence of large latency. The article "NbN Circuits and Packaging for 10 Kelvin IR Focal Plane Array Sensor Signal Processing," *IEEE Trans. on Appl. Suppercon.*, vol.9, pp. 4357–4360, June 1999 discloses a FIFO buffer that uses the MVTL superconducting logic family. However, the device disclosed in this article is physically large and operates in the 1 GHz regime, which is not suitable for SFQ superconductor devices operating in the 10–100 GHz regime. Also, an SFQ-based FIFO buffer that uses a similar logic synthesis would be physically too large, complex, and slow for most applications using SFQ superconducting logic.

What is needed is a FIFO buffer that is suitable for SFQ superconductive circuits which operate in the 10–100 GHz regime. Therefore, it is an object of the present invention to provide an SFQ-based FIFO buffer that enables high data rate, cross-chip and chip-to-chip communication for the superconductive circuits using SFQ logic.

SUMMARY OF THE INVENTION

In accordance with the teachings of the present invention, a digital first-in first-out (FIFO) buffer for use with SFQ superconductive integrated circuits is provided. The digital FIFO buffer includes a clock-storage circuit for receiving and storing load and read clock signals, and a data-storage circuit connected to the clock-storage circuit for receiving and storing at least one data signal in the sequential order that the data signal pulse is received relative to the load clock signal. The data-storage circuit outputs the data signal pulse independent of the load clock signal.

The clock-storage circuit includes a current source and a plurality of first junctions connected to the current source for receiving and storing at least one data signal. The clock-storage circuit also includes at least one second junction connected to one of the plurality of first junctions, but not to the current source, for receiving and storing the data signal pulse(s) in the FIFO buffer. The data-storage circuit includes a plurality of logical zero junctions connected to the clock-storage circuit for acknowledging a logical zero, and a plurality of logical one junctions connected to an associated logical zero junction for acknowledging a logical one. The previously stored clock signals provide physical back pressure to their subsequent signal pulses and enable the FIFO buffer to store only one signal pulse at each junction.

Additional objects, advantages and features of the present invention will become apparent to those skilled in the art from the following discussion and the accompanying drawings and claims.

BRIEF DESCRIPTION OF THE DRAWINGS

FIGS. 3A–3C are block diagrams depicting read and load operations of the digital FIFO buffer, according to the present invention.

DETAILED DESCRIPTION OF THE PREFERRED EMBODIMENTS

The following discussion of the preferred embodiments directed to a digital first-in first-out (FIFO) buffer is merely exemplary in nature and is in no way intended to limit the invention or its applications or uses.

Figure 1:
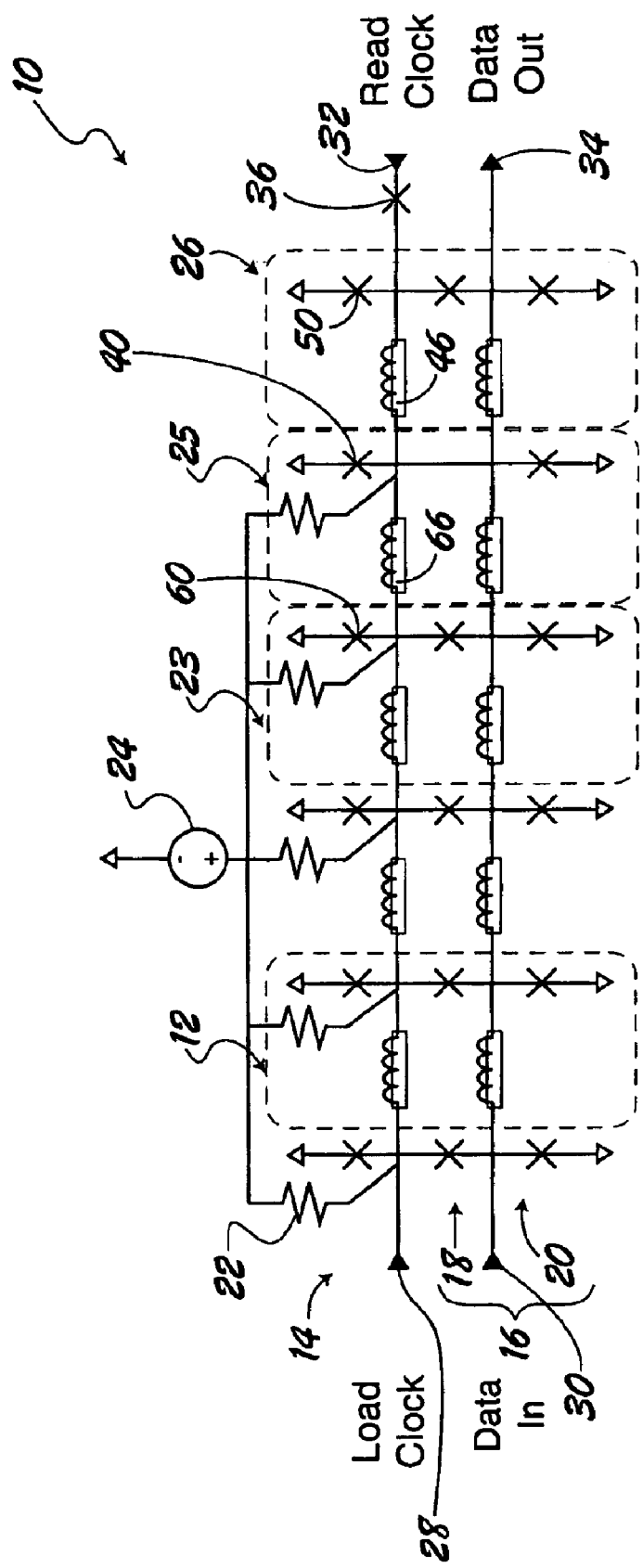
FIG. 1 is a schematic diagram of a digital first-in first-out (FIFO) buffer, according to one embodiment of the present invention.
Figure 2:
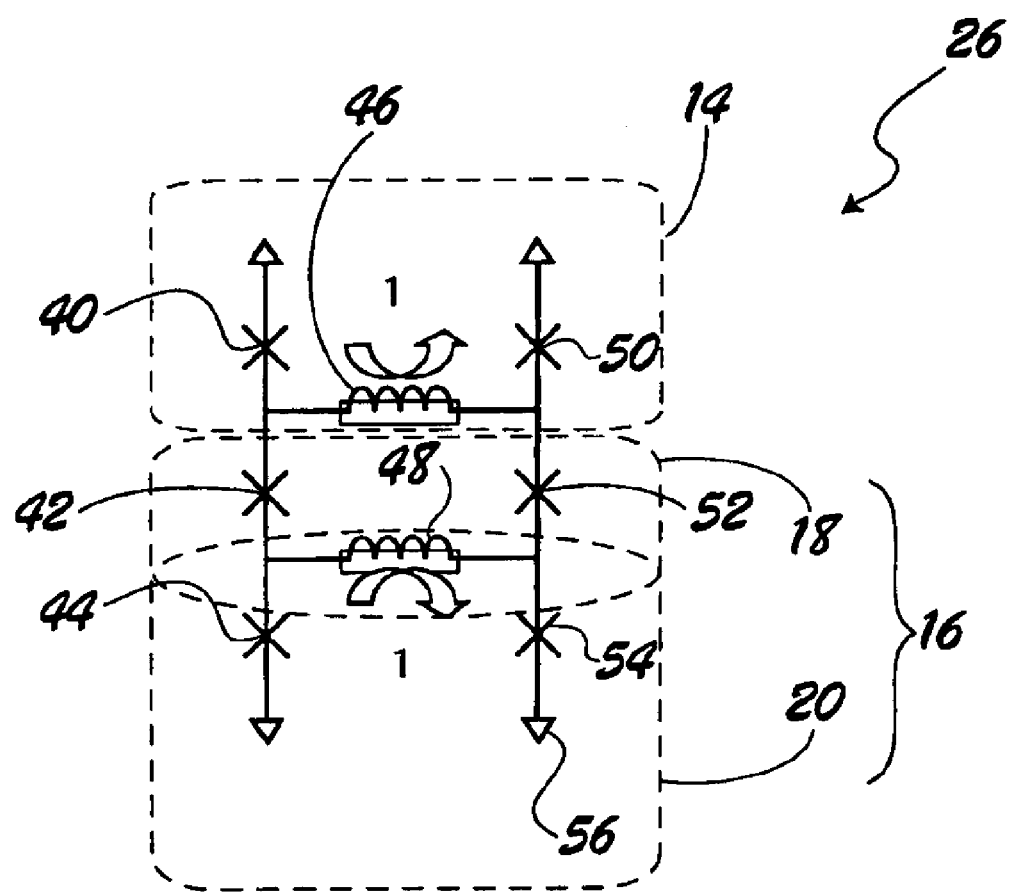
FIG. 2 is an enlarged schematic diagram of one stage of the digital FIFO buffer shown in FIG. 1, according to the present invention.

FIGS. 1 and 2 illustrate a digital FIFO buffer 10 that incorporates a physical back pressure mechanism for a SFQ superconductive circuit in accordance with the present invention. The FIFO buffer 10 includes a plurality of stages 26, shown in FIG. 2, that are connected in series along the FIFO buffer 10. For illustration purposes only, the FIFO buffer 10 in FIG. 1 includes five stages, where each stage 26 includes a clock-storage circuit 14 and a data-storage circuit 16. It should be understood, however, that the FIFO buffer 10 may include more or less than five stages depending on its application.

Each stage 26 includes three Josephson junctions 50, 52, and 54 connected in parallel along the FIFO buffer 10 that provide low power and dense storage per bit. It should be understood that each stage 26 can include more than three Josephson junctions depending on the desired operating margin of its application, thermal noise, variation of its fabrication process and the power available for its operation. By having more than three Josephson junctions, the FIFO buffer 10 can broaden its operating margins and the device can be more robust against failure than when each stage includes three or less Josephson junctions. However, the FIFO buffer 10 becomes slower and requires more power with the addition of more Josephson Junctions.

Each clock-storage circuit 14 includes a plurality of Superconducting Quantum Interference Devices (SQUID) having two Josephson junctions 40 and 50, and an isolation inductor 46 in a symmetrically arranged loop. Each stage 12, 23 and 25 of the clock-storage circuit 14, except a last stage 26, is connected to a bias resistor 22 and to a current source 24 that distributes an equal amount of current to each stage and powers the FIFO buffer 10. The last stage 26 is connected to a previous stage 25, but is not connected to the current source 24 so that it retains the data input SFQ pulse within the digital FIFO buffer 10. The clock-storage circuit 14 has two input ports 28 and 32 connected to first and last stages 12 and 26 of the FIFO buffer 10 for receiving load and read clock signal pulses, respectively.

The data-storage circuit 16 includes a plurality of logical zero junctions 18 connected to the clock-storage circuit 14 in parallel along the FIFO buffer 10, and a plurality of logical-one junctions 20 connected to associated logical zero junctions 18. Each of the logical zero and logical one junctions 18 and 20, respectively, are represented as an equivalent of two SQUIDs sharing an isolation inductor 48. The data-storage circuit 16 includes a data input port 30 and a data output port 34 connected to the first and last stages 12 and 26, respectively, of the FIFO buffer 10. The data input pulses move along the FIFO buffer 10 with their associated load clock signal pulses. The transmission of the data and clock signal pulses along the FIFO buffer 10 is described below in greater detail.

The clock-storage circuit 14 of the FIFO buffer 10 receives the load and read clock signal pulses that are unrelated to each other. The data-storage circuit 16 of the FIFO buffer 10 receives the data signal pulse with respect to the load clock signal pulse and outputs it in association with the read clock signal pulse in the order at which the data signal pulses are received. The FIFO buffer 10, thus, receives the data signal pulses at the load clock rate and stores each bit of the data signal pulses at each stage of the FIFO buffer 10. Further, the FIFO buffer 10 outputs the stored data signal pulses at the read clock rate which is independent of the load clock rate.

As in all SFQ digital circuitry, the data and clock signal pulses are encoded as SFQ voltage pulses corresponding to about 2 mVps, or equivalently, as persistent currents within superconducting loops corresponding to about 2 mApH. To load, the FIFO buffer 10 receives both data and load clock signal pulses at their respective input ports 28 and 30. The parameter of the isolation inductor 46 of each stage 12 and 26 is chosen so that the current of the load clock signal pulse through the isolation inductor added to the DC current is greater than the critical current of each Josephson junction 40 and 50. If the load clock signal satisfies this requirement, each Josephson junction 40 and 50 along the clock-storage circuit flips once, or the clock signal induces a $2\pi$-leap in each junction 40 and 50. In turn, each junction 40 and 50 generates a voltage pulse so that the load clock pulse originating at the load clock input port 28 ripples through empty storage stages, which do not contain any signal pulses at a given time, towards the read clock port 32. When the load clock signal arrives at the last empty stage, the load clock pulse is stored in the instant stage of the clock-storage circuit 14 in the form of a persistent, circulating current. If the FIFO buffer 10 is empty, the load clock signal pulse ripples through each stage and is stored in the last stage 26 which is not connected to the DC current source 24.

For example, when three SFQ load clock signal pulses are introduced at the load clock input port 28, the first pulse ripples through the empty storage stages until it arrives at the last stage 26. The first pulse causes a negative current in the last stage 26 because the last stage 26 is not connected to the current source 24, and does not provide enough current to flip the last Josephson junction 50. More specifically, the SFQ signal pulse has a directionality. When the first pulse arrives at the last stage 26, the first pulse flips the junction 40 of the last stage 26 and induces current to flow from ground 56 through the junction 40. In turn, the current on the junction 40 decreases and causes negative current on the junction 40. The first pulse then flows through the isolation inductor 46 to the junction 50 causing positive current on the junction 50 of the last stage 26. However, the first pulse is stored in the last junction 26 because it does not have enough current to flip the last Josephson junction 50. Because the FIFO buffer 10 is superconducting, the first pulse is stored and persistently stays in the last stage 26 until perturbed.

When the second pulse arrives at the load clock input port 28, it ripples through the empty storage stages until it arrives at the fourth stage 25. At the fourth stage 25, the second pulse flips the junction 60 and the current flows from ground 56 to the isolation inductor 66 and to the junction 40. However, the positive current on the junction 40 carried by the second pulse is not enough to flip the last stage 26 because of the negative current exhibited on the junction 40 from the first pulse. The second pulse is stored in the fourth stage 25 and the positive current carried by the second pulse repels the negative current carried by the first pulse when the second pulse arrives at the fourth stage 25. The total current of the junction 40 shared by the stages 25 and 26, then becomes zero, except for the DC current coming through the bias resistor 22. When the third pulse is introduced to the load clock input port 28, it ripples through the empty storage stages until it arrives at the third stage 23 where the positive current caused by the third pulse repels the negative current caused by the second pulse on the junction 60. The third pulse is then stored in the third stage 23 in the form of a persistent, circulating current.

Concurrently, the data signal pulses originating at the data input port 30 move along with the load clock signal pulse. Generally, each bit of the load clock signal pulses marks a boundary between two adjacent clock periods. Arrival of the SFQ pulse at the data input port 30 of the FIFO buffer 10 during the current load clock period has a binary "1" value of the data signal, while absence of the pulse during this period is a binary "0" value of the signal. The FIFO buffer 10 does not require an exact time coincidence between the clock and data signal pulses, nor does it require a certain time sequence of various input signals, but it requires that each data signal pulse denoting a binary "1" arrives some time during the load clock period.

When the load clock arrives at the first stage 12, it causes either the logical one or zero junctions 20 and 18, respectively, to flip depending on whether the data-storage circuit 16 receives a data signal pulse or detects an absence of the data signal pulse. When the data-storage circuit 16 detects an absence of the data signal pulse, the DC power coming from the current source 24 through the bias resistor 22 flows through each Josephson junction 42 and 52 in the logical zero SQUID 18. More specifically, the DC power triggers the junction 42 of the logical zero SQUID 18 to flip, which then passes the current into the isolation inductor 48 of the data-storage circuit 16. This current flips the junction 52 of the logical zero SQUID 18 within the load clock period. When the load clock signal pulse arrives at the last empty storage stage and gets stored, the binary "0" data signal is stored in the associated logical zero SQUID 18 of the data storage circuit 16.

When the data storage circuit 16 receives a data signal pulse within the load clock period, it induces a current flow through junction 44 in the logical one SQUID 20, but not in the logical zero SQUID 18 which carries lower DC current. The data signal pulse received at the data input port 30 moves along with the load clock pulse signal pulse and ripples through empty storage stages until the load clock is stored at the last empty stage. More specifically, if the logical one SQUID 20 receives the data signal pulse, it induces the junction 44 to flip clockwise as shown in FIG. 2 which then flows through the isolation inductor 48 of the data storage circuit 16 to the junction 54 of the logical one SQUID 20. Thus, as the data signal pulse arrives at the last empty storage stage, it causes negative current on the junction 44 of the logical one SQUID 20 and positive current on the junction 54. The associated logical one SQUID 20 of the data storage circuit 16 then stores the data signal pulse within the load clock period as the load clock signal pulse gets stored in the last empty stage of the FIFO buffer 10.

To read, the read clock signal pulse is introduced at the read clock port 32 and the read clock signal pulse flows to the last stage 26 of the clock-storage circuit 14. The current carried by the read clock pulse is clockwise, and thus adds extra current to the junction 50 of the last stage 26. This extra current induces the total current to exceed the critical current of the junction 50 and causes the junction 50 of the last stage 26 to flip. The counter-clockwise current of the load clock signal pulse and the clockwise current of the read clock pulse are eliminated when they combine. As the read and load clock signal pulses are removed from the FIFO buffer 10, its associated data signal pulse is output at the data output port 34. The load clock signal pulses and their associated data signal pulses stored in the subsequent clock and data storage circuits 14 and 16 of the FIFO buffer 10 move down one stage towards the read clock and data output ports 32 and 34, respectively, after the signal pulses stored in the last stage 26 are removed.

The FIFO buffer 10 may also include an escape junction 36 on the read clock. The escape junction 36 transmits the read clock signal when the FIFO buffer 10 contains SFQ pulses, but flips if the read clock pulse is received when the clock-storage circuit 14 is empty. The escape junction 36 inhibits the read clock signal from being input when the FIFO buffer 10 is empty, and prevents the FIFO buffer 10 from outputting erroneous results. However, because there is less current contained in the escape junction 36 than the junction 50, the read clock pulse causes the junction 50 to flip if the read clock signal pulse is received and the FIFO buffer 10 contains no signal pulse in the storage circuits 14 and 16. It should be understood that the presence of flux stored in the last stage 26 of the FIFO buffer 10 may be detected by using any conventional circuit for detecting a state of the loop as long as these circuits are operable with SFQ superconducting logic circuits.

FIGS. 3A–3C illustrate exemplary read and load operations of the five-stage, digital FIFO buffer 10, according to the present invention. As shown in FIG. 3A, the FIFO buffer 10 contains four load clock pulses 100 and their associated data signal pulses 102 towards the output end of the FIFO buffer 10 at a given time. Each of the load clock pulses 100 is denoted with a binary "1" and the data signal pulses 102 are denoted with either a binary "1" or "0" depending on whether the data-storage circuit 16 received the SFQ pulses within a given load clock period. The load clock pulses 100 circulate counter-clockwise in their clock storage and the data pulses 102 circulate clockwise in their data storage.

FIG. 3B depicts a read operation of the digital FIFO buffer 10. The read clock signal pulse 104 is removed with the load clock pulse 100 stored in the last stage 26 when the read clock signal pulse 104 arrives at the read clock port 32 of the FIFO buffer 10. The read clock signal pulse 104 is denoted with the binary "−1" to indicate its clockwise directionality. As the load and read clock signal pulses 100 and 104, respectively, are eliminated, the FIFO buffer 10 outputs its associated data signal pulse at the data output port 34. The subsequent load clock and data signal pulses 100 and 102 stored in the FIFO buffer 10 are then moved down one stage towards the output port 24 of the FIFO buffer 10.

FIG. 3C illustrates a load operation of the digital FIFO buffer 10. When the load clock pulse 100 is received at the load clock port 28, the data storage circuit 16 receives the data signal pulse 102 within the load clock period defined by the period of time between adjacent load clock pulses 100. When the load clock and data signal pulses 100 and 102 are introduced, they ripple through the empty storage stages until they arrive at the last empty stage, the second stage shown in FIG. 3C. The previous load clock signal pulse 100 stored in the third stage 23 provides physical back pressure to the instant load clock signal pulse rippling through the FIFO buffer 10, and causes it to circulate and be stored in the last empty stage. The data signal pulse 102 flows through the data storage circuit 16 along with its associated load clock pulse 100.

Figure 4:
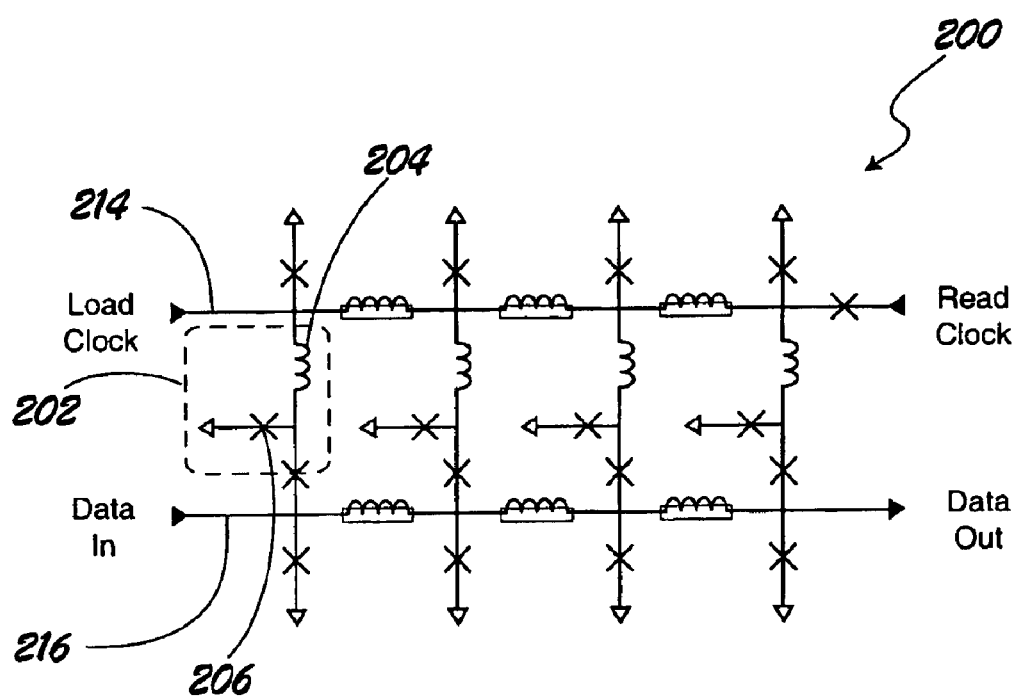
FIG. 4 is a schematic diagram of a digital FIFO buffer, according to another embodiment of the present invention.

FIG. 4 illustrates a digital FIFO buffer 200, according to another embodiment of the present invention, which incorporates the same basic concept as the digital FIFO buffer 10 described above. This embodiment includes a circuit 202, including an isolation inductor 204 and a Josephson junction 206, connected between a clock-storage circuit 214 and a data-storage circuit 216, which function in the same manner described above. The circuit 202 isolates the clock-storage circuit 214 from the data-storage circuit 216, and enhances the robustness of the FIFO buffer 200 against failure. It should be understood that FIG. 4 includes one additional junction for illustration purposes only. However, more than one extra junction may be included when more robustness of the FIFO buffer 10 and 200 is needed. Isolation stages may also be inserted between stages in the data line.

The present invention solves the aforementioned problems by providing a digital FIFO buffer 10 and 200 for use with SFQ superconductive logic circuits operating in the 10–100 GHz regime. In addition, the present invention provides a FIFO buffer that is at least a factor of two more efficient in terms of circuit size, complexity, and power than could be realized using conventional rapid single flux quantum (RSFQ) logic synthesis. The present invention is applicable, but not limited to, superconducting digital circuits for providing high speed communication to external electronics, across chip, and from chip-to-chip using SFQ digital circuits. For example, the present invention may be used in an SFQ 40 Gpbs crossbar switch, known to those skilled in the art.

The foregoing discussion describes merely exemplary embodiments of the present invention. One skilled in the art would readily recognize that various changes, modifications and variations can be made therein without departing from the spirit and scope of the invention as defined in the following claims.

What is claimed is:

1. A single flux quantum (SFQ) superconductive integrated circuit comprising:
   a clock storage circuit for receiving and storing a load clock signal pulse; and
   a data storage circuit coupled to said clock storage circuit for receiving and storing a data signal pulse in a sequential order, said data signal pulse being received relative to said load clock signal pulse, wherein said data-storage circuit outputs said data signal pulse independent of said load clock signal pulse.

2. The integrated circuit of claim 1 wherein said clock storage circuit receives a read clock signal pulse that is independent of said load clock signal pulse.

3. The integrated circuit of claim 1 wherein said clock storage circuit further includes:

a current source;

a plurality of first junctions coupled to said current source for receiving and storing said load clock signal pulse, wherein one of said plurality of first junctions defines an input port; and an end junction coupled to one of said plurality of first junctions for receiving and storing said load clock signal pulse.

4. The integrated circuit of claim 3 wherein said load clock signal pulse propagates through said plurality of first junctions that are empty towards said end junction and occupies a last empty junction.

5. The integrated circuit of claim 3 wherein said read and load clock signal pulses are eliminated when said signal pulses are combined and said end junction is emptied.

6. The integrated circuit of claim 5 wherein each of said load clock signal pulses stored in said first junctions move down through said plurality of first junctions and said end junction that are empty towards said end junction in sequential order of said load clock signal pulses being received when said read and load clock signal pulses are eliminated.

7. The integrated circuit of claim 3 wherein each of said plurality of first junctions and said end junction includes a Josephson junction and an isolation inductor connected in a symmetrically arranged loop.

8. The integrated circuit of claim 1 wherein said data storage circuit further includes a plurality of logical zero junctions coupled to said clock-storage circuit for receiving a logical zero.

9. The integrated circuit of claim 8 wherein said logical zero junctions acknowledge an absence of said SFQ signal pulse in association with said load signal pulse.

10. The integrated circuit of claim 8 wherein said data storage circuit further includes a plurality of logical one junctions connected to said logical zero junctions for transmitting a logical one SFQ signal pulse.

11. The integrated circuit of claim 10 wherein said logical one junctions acknowledge said logical one SFQ signal pulse in association with said load clock signal pulse.

12. A superconductive integrated circuit comprising:

a clock storage circuit for receiving a plurality of load clock signal pulses from a first input port, wherein said clock storage circuit includes a plurality of stages for storing said load clock signal pulses; and a data storage circuit coupled to said clock storage circuit for receiving and storing a plurality of data signal pulses in a sequential order of said data signal pulses being received in association with said load clock signal pulses, wherein said data signal pulses ripple through said plurality of stages along with said load clock signal pulses, wherein previously stored load clock signal pulses provide back pressure to said load clock signal pulses that are subsequently stored and enable said clock storage circuit to store only one load clock signal pulse in each of said stages.

13. The integrated circuit of claim 12 wherein said clock storage circuit also receives a read clock signal pulse from a second input port.

14. The integrated circuit of claim 13 wherein each of said load and read clock signal pulses propagate through said plurality of stages that are empty towards said second input port and occupy a last stage that is empty.

15. The integrated circuit of claim 13 wherein said data storage circuit outputs said data signal pulse in accordance with said read clock signal pulse.

16. The integrated circuit of claim 13 wherein said load and read clock signal pulses are SFQ signals transmitted in the 10–100 GHz range.

17. The integrated circuit of claim 12 wherein said clock storage circuit further includes:

a current source;

a plurality of first junctions coupled to said current source for receiving and storing said load clock signal, wherein one of said plurality of first junctions defines the first input port; and an end junction connected to one of said plurality of first junctions for receiving and storing said load clock signal.

18. The integrated circuit of claim 12 wherein said data storage circuit further includes:

a plurality of logical zero junctions coupled to said clock storage circuit for receiving a logical zero data signal defining an absence of said data signal pulse in association with said load clock signal pulse; and a plurality of logical one junctions coupled to said logical zero junctions for receiving a logical one data signal pulse in association with said load clock signal pulse.

19. An SFQ superconductive integrated circuit comprising:

a clock storage circuit for receiving load and read clock signal pulses from first and second input ports, wherein said clock storage circuit has a plurality of stages for storing said load clock signal pulses in an order of said load clock signal pulses being received; and a data storage circuit coupled to said clock storage circuit for receiving and storing a plurality of data signal pulses in a sequential order of said data signal pulses being received in association with said load clock signal pulses, wherein said data signal pulses propagates through said plurality of stages in association with said load clock signal pulses, said data storage circuit outputs a first-received data signal pulse that is received prior to the other data signal pulses when said read clock signal pulse is received, wherein previously stored load clock signal pulses provide back pressure to said load clock pulses being stored subsequently and enable said clock storage circuit to store only one signal pulse in each stage.

20. The integrated circuit of claim 19 wherein each of said load and read clock signal pulses are eliminated in one of said plurality of stages containing said first-received data signal pulse when said read clock signal pulse is received.

* * * * *